United States Patent [19]
Han

[11] Patent Number: 5,878,789
[45] Date of Patent: Mar. 9, 1999

[54] MECHANICAL PRESS MACHINE FOR FORMING SEMICONDUCTOR PACKAGES

[75] Inventor: Hyo Yong Han, Inchon, Rep. of Korea

[73] Assignee: Trimecs Co., Ltd., Inchon, Rep. of Korea

[21] Appl. No.: 917,115

[22] Filed: Aug. 25, 1997

[51] Int. Cl.⁶ .................................................. B21F 45/00
[52] U.S. Cl. .............................................. 140/105; 72/4
[58] Field of Search .............................. 140/105; 72/441, 72/4; 192/125 B, 129 R

[56] References Cited

U.S. PATENT DOCUMENTS

| | | | |
|---|---|---|---|
| 3,367,168 | 2/1968 | McHenry et al. | 72/441 |
| 5,443,101 | 8/1995 | Fierkens | 140/105 |

FOREIGN PATENT DOCUMENTS

| | | | |
|---|---|---|---|
| 92/04145 | 3/1992 | WIPO | 140/105 |

*Primary Examiner*—Lowell A. Larson
*Attorney, Agent, or Firm*—Bacon & Thomas, PLLC

[57] ABSTRACT

The present invention relates to a press for trimming and forming lead frames of semiconductor packages which have been molded in order to form individual semiconductor chips. The press machine for forming semiconductor packages according to the present invention is able to perform punching operation at low noise and high speed by vertically moving the upper mold mounted on an movable plate through a crank mechanism which is operated by a servomotor and has a characteristic of performing accelerated and decelerated motion with rotation, and also able to drive a feeding device by using the power of the servomotor which drives the press device, without using other driving source. And when there is caused such a trouble that a lead frame gets off the correct position, punching operation is interrupted to prevent any damage on semiconductor packages and a mold by lifting the movable plate provided with an upper mold. The measure can be performed with ease by the feeding finger lifting device for lifting the feeding finger in such a case.

1 Claim, 6 Drawing Sheets

MECHANICAL PRESS MACHINE FOR FORMING SEMICONDUCTOR PACKAGES

FIELD OF THE INVENTION

The present invention relates to a press machine for trimming and forming lead frames of semiconductor packages which have been molded, to thereby produce individual semiconductor chips, and more specifically a mechanical press machine for forming semiconductor packages which are so constructed as to perform a punching operation by actuating crank mechanism by a servomotor and also perform a feeding operation of lead frames by use of the power of the servomotor without a separate power source.

BACKGROUND OF THE INVENTION

As a press, a variety of machines are employed depending on the kinds of plastic workings and they are broadly broken down into a hydraulic press using fluid pressure of oil, water, air or the like, and a mechanical press using mechanical force.

In the case of a conventional press for forming semiconductor packages, generally, the press unit for punching lead frames is driven by an oil hydraulic cylinder, while the feeding mechanism for feeding operation is driven by an air hydraulic cylinder.

The press driven by an oil hydraulic cylinder can be provided in a relatively simple structure by use of an oil hydraulic cylinder, various valves and the like, but often causes a problem of oil leaking from the cylinder during operation and moreover causes hardness of hearing to field operators due to big noise generated at the time of switching valves or noise of punching because as high a pressure as 100 kg/cm² or higher is employed. In addition, the punching rate of around 60 punchings per minute is too slow to keep pace with the recent trend of massive and speedy production of semiconductors. Therefore, use of a conventional oil hydraulic press to meet the production demand would require a multitude of equipments and a number of persons to operate the equipments, whereby not only a large space out of a semiconductor plant need to be alloted but also large economic loss due to the elated installation costs and lowered productivity would results.

And a feeding mechanism for feeding lead frames as workpieces is driven by a pneumatic cylinder which is operated discretely from and at a markedly higher speed than the oil hydraulic cylinder for driving the press. This discrete use of driving sources of an oil hydraulic device and a pneumatic device acts as a hindrance in improving throughput of trimming and forming process. Further, reliance in operation is hardly secured in the case that a pneumatic feeding device is used in connection with other devices using pneumatic pressure, because the air supply fluctuates widely in pressure and in flow rate in accordance with the number of pneumatic devices used in the production process.

To cope with the above described problems, there was proposed a mechanical press driven by a servomotor and a method for controlling the same in Korean unexamined patent publication 89-700079, which press is so arranged as to acquire punching stroke by turning the rotating motion of a servomotor into a reciprocating motion of a ram through a mechanical power transmission mechanism, and is able to minimize noises generated in a press by reducing the speed of a ram below a certain level at the instant of impact on a workpiece by a tool which is attached on the tip of ram through controlling the rotating speed and direction of the servomotor, whereby there is realized an advantage that major problems of an oil hydraulic press such as decreased processing speed and low productivity are resolved.

However, a press as described above had a problem that a lot of time loss and economic loss are encountered from maintenance and repair work in an effort to prevent service life shortage of a servomotor which results from overload and overheat owing to excessively frequent switchings of the rotational direction of a servomotor. And, as rotational switching needs to go through a step of pause, another problem is posed that high productivity is not expected due to a longer operating time consumed for a single stroke.

Besides, there was not solved the problem of reduction in productivity and reliability of operation of the feeding device due to the difference between the speeds of the driving source for the press and the driving source for the feeding device, caused by use of a pneumatic device for the feeding device apart from the press, as described previously.

SUMMARY OF THE INVENTION

The present invention that was devised to resolve the above described problems has the object to provide a press machine for forming semiconductor packages which allows punching operation at reduced noise and increased speed by moving up and down the upper mold mounted on a moving plate through the use of a crank mechanism, which is operated by a servomotor and has a characteristic of deceleration and acceleration during a rotation.

Another object of the present invention is to provide a press machine for forming semiconductor packages, which allows a feeding device to be driven by use of the same power of a servomotor that drives the press device without using a separate driving source.

A further object of the present invention is to provide a press machine for forming semiconductor packages, which is so constructed as to prevent damage on the semiconductor packages and the molds by interrupting the punching operation through the ascent of a movable plate on which an upper mold is mounted, in such a problematic case that a lead frame is placed deviated from a correct position.

A still further object of the present invention is to provide a press machine for forming semiconductor packages, which is equipped with a feeding finger lifting device for lifting a feeding finger so that a proper measure is readily taken in such a problematic case that a lead frame is placed deviated from a correct position.

BRIEF DESCRIPTION OF THE DRAWINGS

A preferred embodiment of a press machine for forming semiconductor packages according to the present invention will now be described by referring to the accompanying drawings.

DETAILED DESCRIPTION OF THE INVENTION

Figure 1:
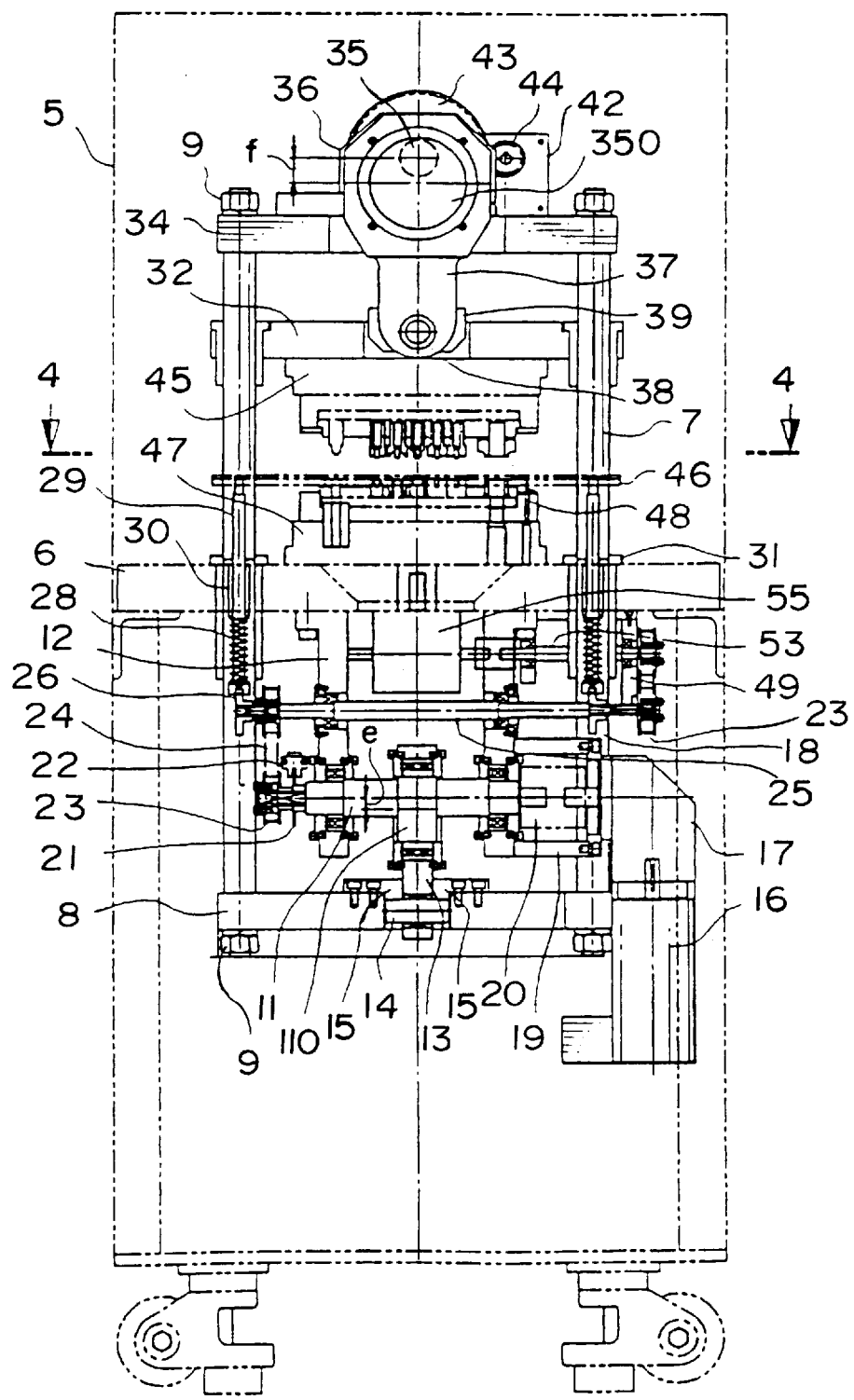
FIG. 1 shows a front view of a press machine according to an embodiment of the present invention.
Figure 2:
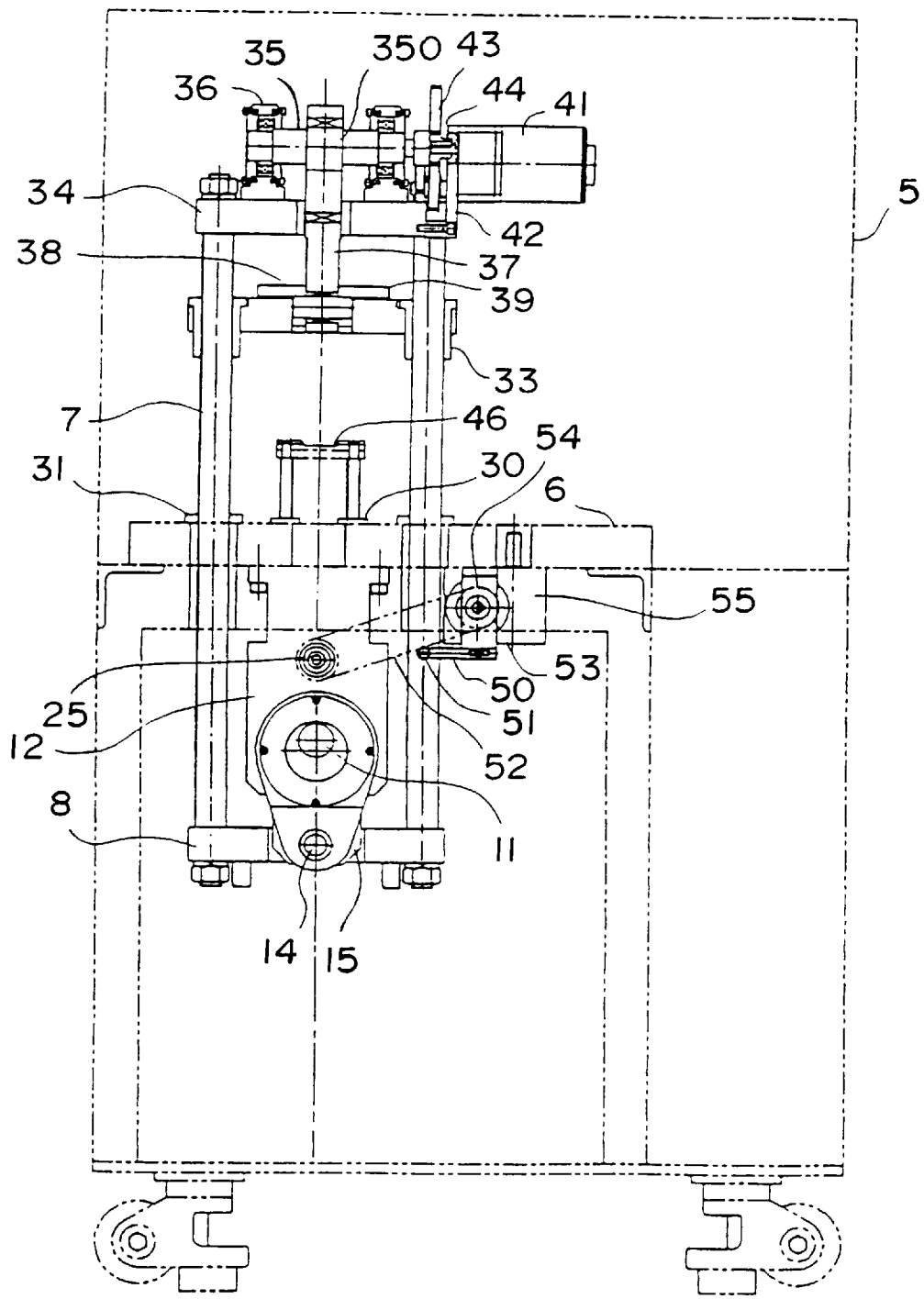
FIG. 2 shows a right side elevation of a press machine according to an embodiment of the present invention.
Figure 3:
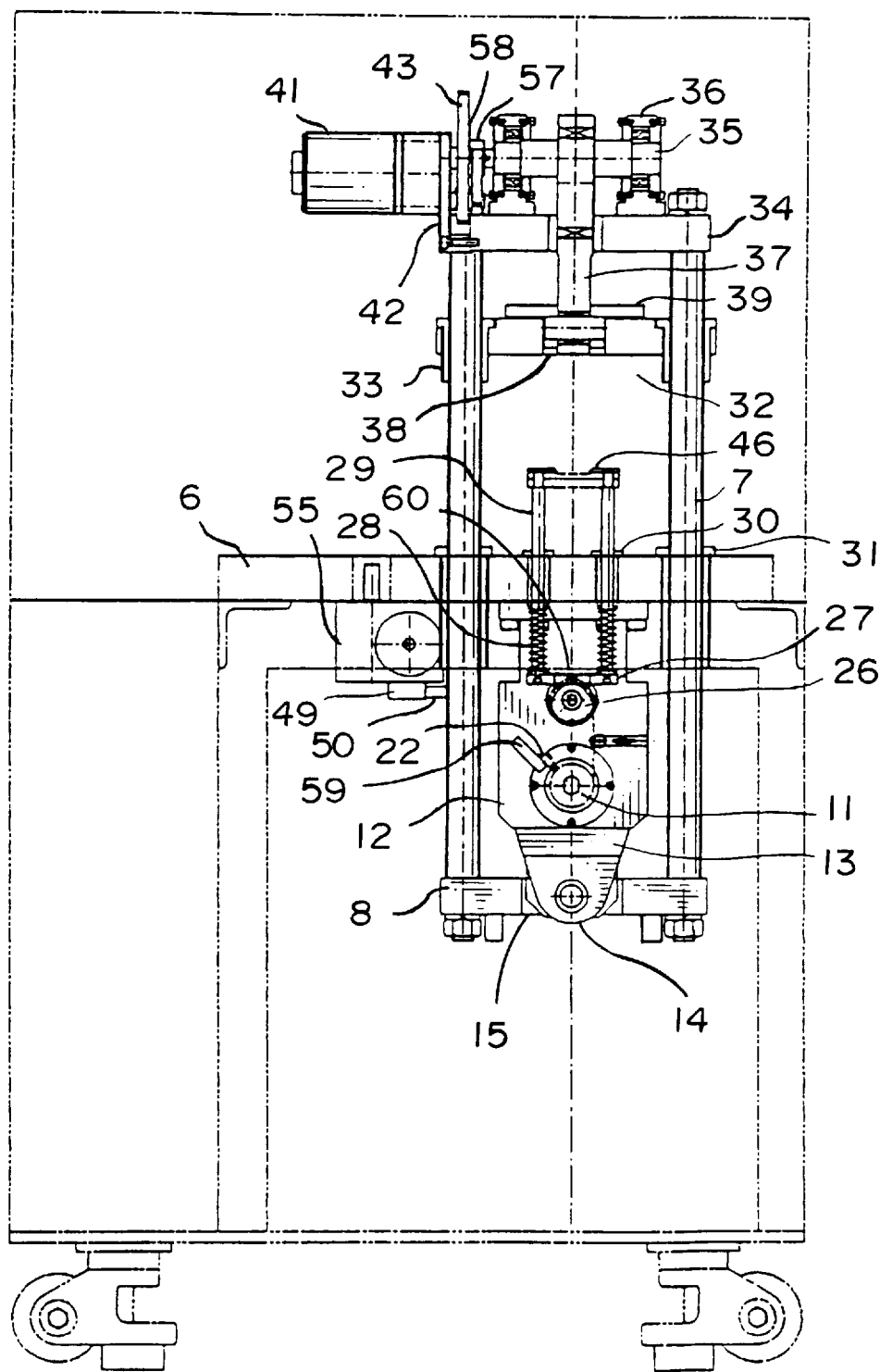
FIG. 3 shows a left side elevation of a press machine according to an embodiment of the present invention.

A press machine according to the present invention consists of a press unit for punching lead frames and a feeding unit for feeding lead frames, and firstly a press unit will be explained with regard to FIG. 1, which shows a front view of a press machine according to the invention.

In the middle of a frame 5 of box shape, there is fixed a stationary plate 6, through which lifting axes 7 are fitted in guide bushes 31, and at opposite ends of the lifting axes 7 there are fixedly secured a bottom plate 8 and an top plate 34 by clamp nuts 9. On the lifting axes 7, there is slidably mounted a movable plate 32, below which an upper mold 45 for forming semiconductor packages is attached.

Below the stationary plate 6, there is attached a supporting block 12, under which a crankshaft 11 is supported through bearings. The crankshaft 11 is connected to a servomotor 16 at its one end through a coupling 20 and a gear head 17 so that the torque of the servomotor may be transmitted to the crankshaft 11. The gear head 17 and the servomotor 16 are fixed to one side of the supporting block 12 by way of the motor fixing plates 18 and linking brackets 19.

In the middle of the crankshaft 11, there is disposed a circular eccentric part 110 to be eccentric to the center of the crankshaft 11 (eccentricity: e), and the eccentric part 110 is fitted with a connecting plate 13, which in turn is connected to a bottom plate 8 through a connecting pin 14 and a connecting block 15, so that the rotating motion of the crankshaft 11 is converted to the vertical motion of the bottom plate 8. With the vertical motion of the bottom plate 8, the top plate 34, the movable plate 32 and the upper mold 45, all of which are connected to the bottom plate 8 via the lifting axes 7, are also caused to move up and down in concurrence with the bottom plate 8.

The present embodiment was explained with an example as an eccentric part formed at the central position of a crankshaft 11, but an ordinary type of crankshaft with a "U" shape may be used.

On the other hand, on the top plate 34, there is disposed a safety override arrangement comprising an upper crankshaft 35 through a supporting block 36, and a connecting plate 37 is fitted on a central eccentric part 350 (eccentricity: f) of the upper crankshaft 35 and the connecting plate 37 is fixed on the movable plate 32 through a connecting pin 38 and a connecting block 39. The top plate 34 is provided with a motor 41 through a bracket 42 on its rear part, and a pinion 44 on a shaft of the motor 41 and a gear 43 on the upper crankshaft 35 are engaged with each other. The rotational position of the upper crankshaft 35 in accordance with the rotation of the motor 41 can be detected by two position detecting sensors 58 fixed on a sensor bracket 57.

In the press unit constructed as described above, the bottom plate 8, the top plate 34, the movable plate 32, and the upper mold 45 are moved vertically at the same time over a distance of two times the eccentricity "e" to perform the punching operation by the servomotor 16, and the movable plate 32 and the upper mold 45 can be vertically moved along the lifting axes 7 over a distance of two times of the eccentricity "f" by the motor 41. The motor 41 is actuated only in problematic cases as when a lead frame is placed away from an adequate position to cause the movable plate 32 provided with the upper mold 45 to ascend along the lifting axes 7 so that punching operation is interrupted to avoid any damage on the semiconductor package or the molds.

Next, the construction of a feeding device will be described. A feeding device is driven by the power transmitted from the servomotor 16, just as the press device, and in synchronization with the rotation of the crankshaft 11. And the feeding operation is divided into the back and forth movement of a feeding finger 81 and the up and down movement of a guide rail 46.

The supporting block 12 disposed below the stationary plate 6 is provided with not only a crankshaft 11 but also a driving shaft 25 for feeding device, which driving shaft is connected to the crankshaft 11 through a timing pulley 23 and a timing belt 24 to receive the torque transmitted from the servomotor 16. As the feeder driving shaft 25 is rotated, plate cams 26 fixed at both ends of the feeder driving shaft 25 are rotated along with it. A connecting bar 27, fixedly provided with two guide rail supporting bars 29, is brought into contact with the top surface of the plate cam 26 through a bearing 60 by the elastic force of springs 28, so that the guide rail supporting bars 29 may be reciprocated up and down through a guide bush 30 as the plate cam 26 is rotated. On the top of the guide rail supporting bars 29 there is fixedly disposed a guide rail 46. Accordingly, the guide rail 46 is caused to move up or down in accordance with the contour curve of the plate cam 26. That is, a rotating movement of the plate cam 26 is turned into a vertical rectilinear motion of the guide rail 46.

At the right end side of the feeder driving shaft 25, another timing pulley 23 is provided to drive a rotating shaft 53, which is mounted on a supporting plate 49 and serves to transmit a torque of the feeder driving shaft 25 to the input shaft of a rocking drive 55 through a coupling 56. The rocking drive 55 is provided with a rotating arm 82 at its output shaft. The rotating arm 82 is provided at its end with a bearing 83, which is positioned at a predetermined distance from the center of the output shaft of rocking drive 55 as shown in FIGS. 5 and 6.

Figure 4:
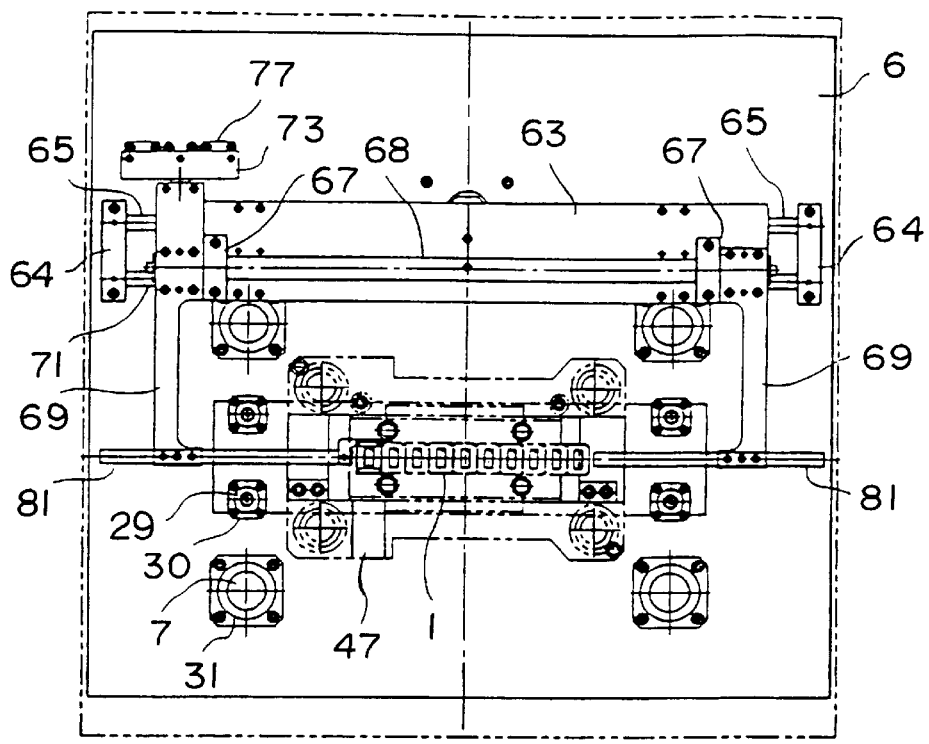
FIG. 4 shows the cross section taken along the line A–A' of FIG. 1 or a plan of a feeding device in the press machine according to an embodiment of the present invention.
Figure 5:
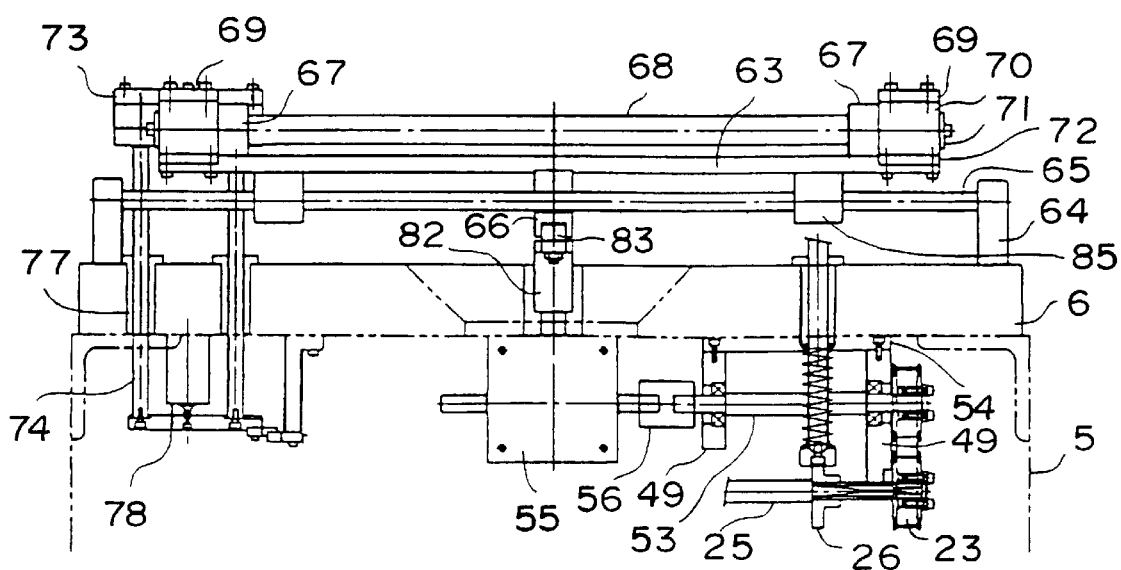
FIG. 5 shows the front view of the feeding device shown in FIG. 4.

As clearly shown in FIGS. 4 and 5, the feeding finger 81 is fixed to feeding finger holders 69, which are secured on a feeding plate 63 through fixing blocks 67 and washers 71, which are fitted at the both ends of a connecting bar 68 respectively and thus fixed on the feeding plate 63.

The feeding plate 63 is provided with bearing blocks 85 and a bearing guide 66 on its underside, a guide bar 65 passes through the bearing blocks 85 and the bearing guide 66 to be mounted on both ends of supporting blocks 64, and the bearing 83 formed on the end of a rotating arm 82 is engaged in the groove formed on the underside of the bearing guide 66. Thus, the bearing guide 66 is moved back and forth along the guide bar 65 with the rotation of the rotating arm 82, and simultaneously the feeding plate 63, the feeding finger holder 69 and the feeding finger 81 are also moved back and forth in unison. That is, the rotating motion of the servomotor 16 is transformed into the reciprocating motion of the feeding finger 81 so as to perform the feeding operation of the lead frames. A feeding operation of workpieces in response of a reciprocating feeding finger is well known and therefore its explanation will be omitted here.

Next, a feeding finger lifting device for lifting the feeding finger to take a proper measure, in a case when a lead frame for forming is placed deviated from a correct position or the like, will be explained by referring to FIGS. 4 and 6.

Figure 6A:
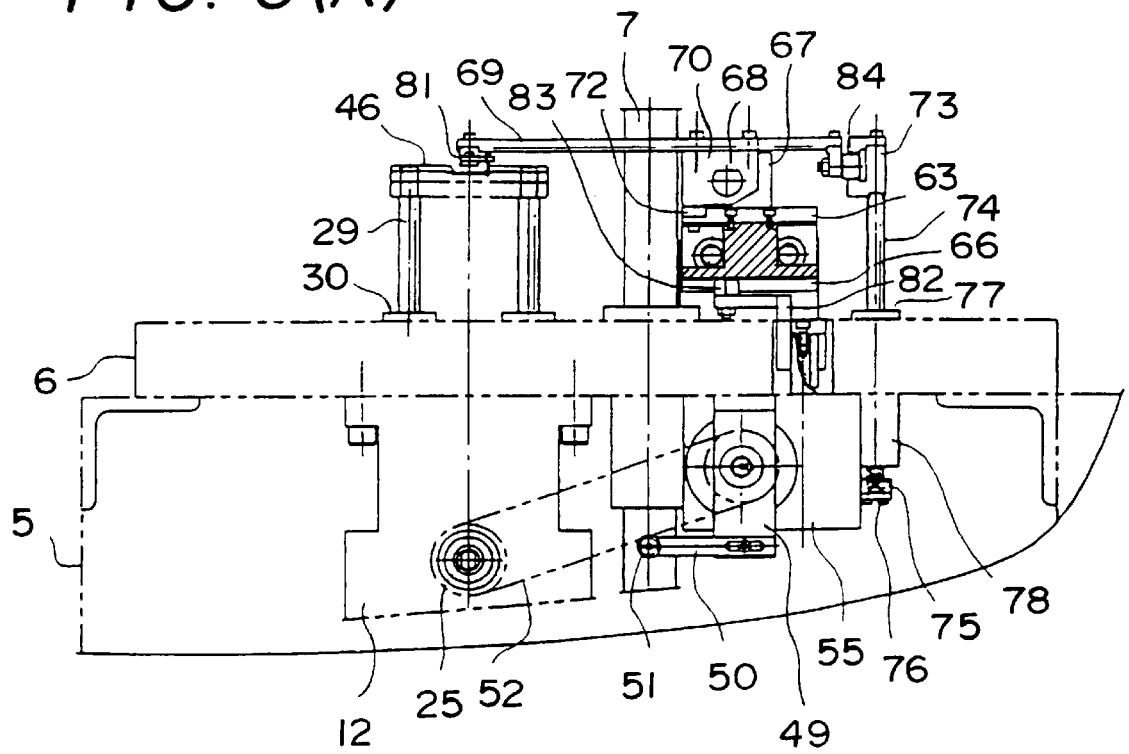
FIG. 6(A) shows the right side elevation of the feeding device shown in FIG. 4.
Figure 6B:
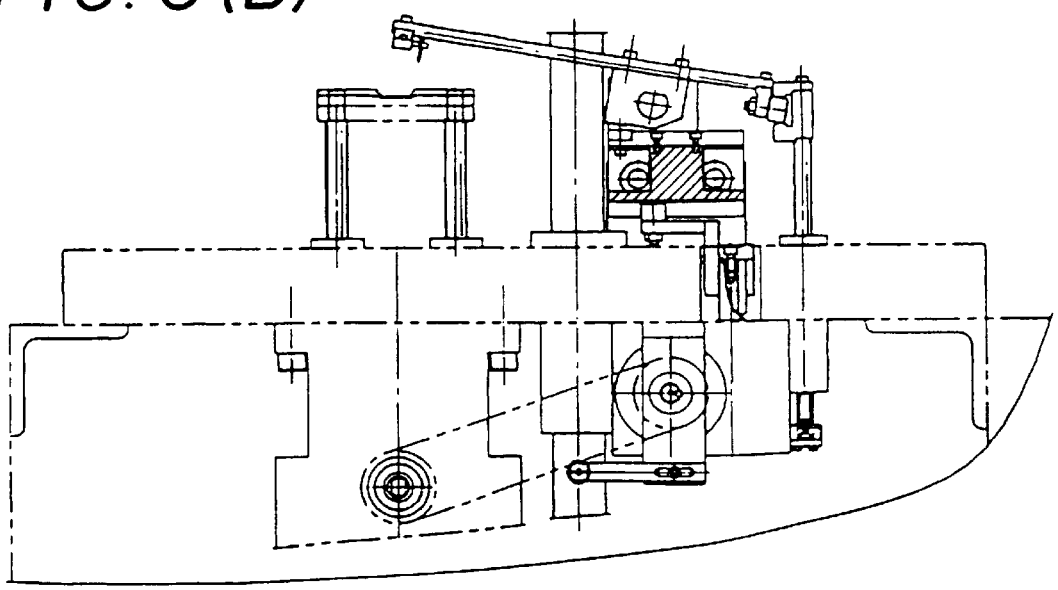
FIG. 6(B) shows the state in which the feeding finger shown in FIG. 6(A) is raised.

A bearing 84 which is disposed at the end of at least one of the feeding finger holders 69 is moved along the bearing guide 73, with the reciprocating movement of the feeding finger 81. The bearing guide 73 is movable up or down by a pneumatic cylinder 78 through a guide bar 74 and a guide bush 77 as seen in FIGS. 6(A) and 6(B). When the pneumatic cylinder 78 moves downward, the feeding finger holder 69 is caused to turn around the connecting bar 68 as a turning center and as the result, the feeding finger 81 is moved upward. In a reverse case of an ascending pneumatic cylinder 78, the feeding finger holder 69 is caused to take a horizontal position as shown in FIG. 6(A), and a precise horizontal position of the feeding finger holder 69 is assured by the contact of a projection formed on a holder supporting block 70 onto a stopper 72 formed on the feeding plate 63.

The operation of the mechanical press machine for forming lead frames according to the present invention constructed as described above will now be explained by referring to FIGS. 7(A) and 7(B). First, a punching operation by a vertical movement of the upper mold or the operation of the press device will be described.

Figure 7A:
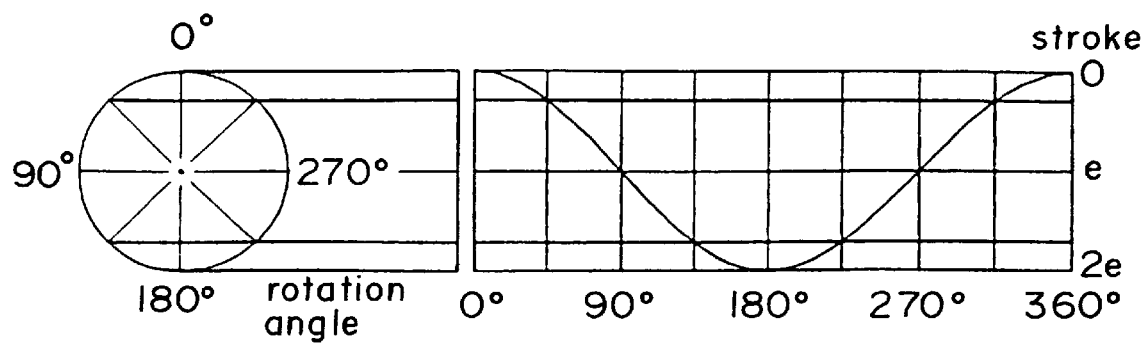
FIGS. 7(A) and 7(B) are graphic diagrams showing the characteristic motion of the crank mechanism and the motion of respective parts with the rotation of the crankshaft respectively.

FIG. 7(A) is a graphic diagram showing operating characteristic of a crank mechanism, wherein positions of the upper mold moving up or down with the rotation of a crank mechanism is illustrated.

The power produced by the servomotor 16 is transmitted to the crankshaft 11 through the coupling 20, while the torque is increased and the speed is reduced through the gear head 17. When the crankshaft 11 starts to rotate at a rotation angle of 0° as shown in FIG. 7(A), the rotating movement of the crankshaft 11 is turned into the downward movement of the bottom plate 8 through the connecting plate 13 and the connecting pin 14, and accordingly the lifting axes 7 and the top plate 34 integrally coupled to the bottom plate 8, are moved downward, and at the same time, the movable plate 32, which is suspended to the top crank shaft 35 on the top plate 34 through a connecting plate 37 and a connecting pin 38 and which has the upper mold 45, is caused to move downward. When the crankshaft 11 is rotated 180°, the upper mold 45 reaches the bottom dead point, and from that point on, the upper mold 45 starts to rise again to finally reach the top dead point at 360°. In this manner, the upper mold 45 which is moved up and down by the crankshaft 11 reciprocates at a stroke of two times the eccentricity "e" to perform the punching operation. As shown in FIG. 7(A), the upper mold 45, in accordance with the inherent kinetic characteristic of the crankshaft 11, starts at the top dead point with acceleration and thereafter decelerates gradually before reaching the bottom dead point at a minimum speed, resulting in a minimized noises at the time of punching on the workpieces.

Now, upward or downward movement of the guide rail will be explained.

As the feeder driving shaft 25 for a feeding device is rotated by the rotating force transmitted from the timing pulley 23 disposed on the crankshaft 11, the guide rail supporting bar 29 is caused to move up or down in accordance with a contour of the plate cam 26 which is secured on the feeder driving shaft 25 to rotate therewith, and the guide rail supporting bar 29 is so lowered as to seat the guide rail 46 on a lower mold 47 before the upper mold 45 reaches the bottom dead point. When the upper mold 45 moves up following the punching operation, the guide rail supporting bar 29 ascends back to the original position along the contour of the plate cam 26.

The feeding operation of lead frames by the feeding finger 81 is performed as follows. The timing pulley 23 secured on the right end of the feeder driving shaft 25 acts to transmit the power from the servomotor 16 to the rocking drive 55, which transforms the rotating motion of its input shaft into a rotating motion in its perpendicular direction.

As the output shaft of the rocking drive 55 and a rotating arm 82 secured on the output shaft are rotated, the bearing 83 mounted on the end of the rotating arm 82, at a predetermined distance from the center of the output shaft, is caused to rotate, whereby the bearing guide 66 is reciprocated back and forth along the guide bar 65. As described above, the bearing guide 66 is fixed on the underside of the feeding plate 63 and the feeding finger 81 is secured on the feeding plate 63 through the feeding finger holder 69, so the feeding finger 81 is reciprocated or a feeding operation of lead frames is performed in response to the reciprocating motion of the bearing guide 66.

Figure 7B:
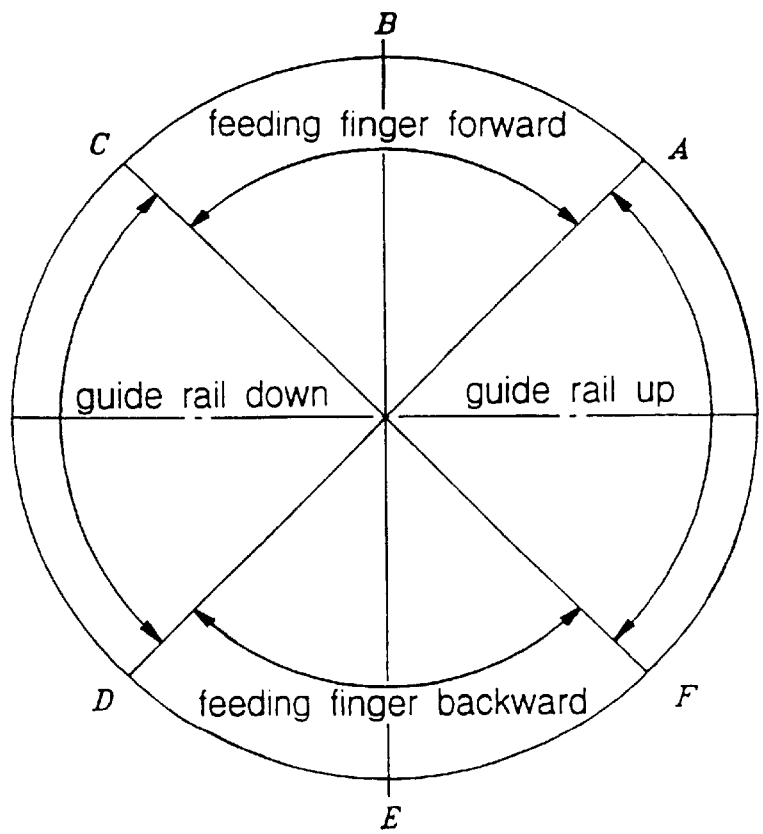

A mutual associated operation of the individual devices explained above is explained by referring to FIG. 7(B). FIG. 7(B) is a diagram showing the states of motion of respective parts in response to the rotation of the crankshaft 11, in which the point "A" represents the state when a groove in a sensor dog 21 is sensed by an origin detecting sensor 22, and at that time the upper mold is positioned amidst the top dead point and the bottom dead point.

When the driving force of the servomotor 16 is applied, the crankshaft 11 passes through points A, B, C, D, E and F to arrive at "A" again, while the upper mold 45 descends, and after punching operation, ascends again to the original point.

While the crankshaft 11 is rotated from the point "A" to "C", that is, while the upper mold 45 returns to its original position following an ascending travel up to the top dead position "B", the feeding finger 81 finishes advancing movement of feeding finger to feed a lead frame 1 into the mold by one pitch.

Thereafter, while the crankshaft 11 is rotated from the point "C" to the point "E", or before the upper mold 45 reaches the bottom dead point to perform punching operation, the guide rail 46 descends (from the point "C" to the point "D") in accordance with the contour of the plate cam 26 to be seated on the lower mold and the feeding finger 81 retreats back for the next feeding operation. After the punching operation, as the crankshaft 11 is rotated to the original position "A", the guide rail 46 also ascends to the original position to thereby complete one full cycle. The cycle of operation described as above is successively repeated by a unidirectional rotation of the servomotor 16.

If in the course of such an operation, the position of a lead frame 1 fed by the feeding finger 81 in the guide rail 46 is deviated due to a vibration or the like so that a position determining hole in the lead frame 1 does not engage with a sensing pin (not shown) but some other part than the hole presses the sensing pin, a malfunction signal is transmitted to a controller (not shown), which then drives a motor 41 to turn a crankshaft 35 by 180°.

As the upper crankshaft 35 is rotated, the movable plate 32 and the upper mold 45 are immediately raised on lifting axes 7 by an amount of two times the eccentricity "f", therefore the punching operation on a lead frame by the upper mold 45 is avoided even if the lifting axes 7 are lowered. As the result, any damage on semiconductor packages and mold parts or the like due to punching the misplaced lead frame can be assuredly prevented.

Further, during the above described operation, the controller demands to raise the feeding finger 81 at a certain angle through the operation of the pneumatic cylinder 78 in order to facilitates repositioning or removal of the lead frame fed erroneously as shown in FIG. 6(B). The operation of raising the feeding finger 81 may optionally be carried out by using a separate manual switch.

As described above, a mechanical press machine for forming semiconductor packages according to the present invention can prevent overload and overheat as would result from normal- and reverse-rotation of a conventional motor, by performing the punching strokes of a press device through the crank mechanism drive by the unidirectional continuous operation of the servomotor, and also markedly increase the number of punchings per minute to thereby improve productivity by eliminating unnecessary stop and revere rotating motion by adopting the unidirectional continuous rotation of the servomotor, and further can minimize punching noises by keeping the punching speed at possible minimum at punching instant. And a major cause for the decreased productivity is removed, because the same driving source for the press device is also used for driving the feeding device without using other driving source and thus the difference in the mutual movements is removed even in a high speed operation.

Further, as the upper mold and a feeding finger can be easily raised to a desired level in case of emergency, maintenance and repair of the device can be easily conducted.

A mechanical press machine for forming semiconductor frames described above is a simply illustrative embodiment of the present invention and therefore a variety of modifications and alterations would be possible within the scope of the appended claims as representing the spirit of the present invention. For instance, it would be evident to a man skilled in the art that the construction shown in the embodiment explained above is applied to presses for other purposes than that for forming lead frames or the power transmitting construction is implemented in a different manner or the like.

What is claimed is:

1. A press machine for forming semiconductor packages, comprising:

a frame;

a stationary plate disposed in a middle of said frame;

a lower mold disposed on top of said stationary plate;

an upper mold for punching workpieces, said upper mold being reciprocated over said lower mold;

a first motor mounted on said frame;

a guide rail for seating workpieces on said lower mold, said guide rail being reciprocated between said upper mold and said lower mold;

a press power transmitting means for turning rotating force of said first motor into a reciprocating motion of said upper mold, said press power transmitting means including a lower crankshaft provided with a first eccentric part in its middle position, lifting axes for reciprocating through said stationary plate, a movable plate disposed on an upper part of said lifting axes and provided with said upper mold on its underside, a bottom plate secured on a bottom part of said lifting axes, and a first connecting plate and a first connecting pin for connecting said first eccentric part with said bottom plate in order to turn eccentric rotational motion of said first eccentric part of said lower crankshaft into a rectilinear reciprocating motion of said bottom plate, said lower crankshaft being rotated by said first motor;

a guide rail driving means for turning rotating force of said first motor into a reciprocating motion of said guide rail, said guide rail driving means including a plate cam driven by said first motor and guide rail supporting bars which are in elastic contact with said plate cam through springs for reciprocating through said stationary plate with the rotation of said plate cam, said guide rail being secured on top of said guide rail supporting bars;

a top plate secured on top of said lifting axes; and a safety override arrangement for preventing damage of said workpieces and said upper and lower molds, said safety override arrangement including an upper crankshaft disposed on said top plate and provided with a second eccentric part, a second connecting plate and a second connecting pin for connecting said second eccentric part with said movable plate in order to turn rotating motion of said upper crankshaft into a rectilinear motion of said movable plate on said lifting axes when one of said workpieces is misaligned in said guide rail, said rectilinear motion of said movable plate on said lifting axes preventing said reciprocating motion of said upper mold by said power transmitting means from bringing said upper mold into contact with said lower mold and said one of said workpieces on said lower mold, and a second motor which drives said upper crankshaft.

* * * * *